United States Patent
Lung (10) Patent No.: US 7,964,863 B2
(45) Date of Patent: *Jun. 21, 2011

(54) MEMORY CELL HAVING A SIDE ELECTRODE CONTACT

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/647,349

(22) Filed: Dec. 24, 2009

(65) Prior Publication Data

US 2010/0133500 A1    Jun. 3, 2010

Related U.S. Application Data

(63) Continuation of application No. 11/864,273, filed on Sep. 28, 2007, now Pat. No. 7,663,135.

(60) Provisional application No. 60/887,541, filed on Jan. 31, 2007.

(51) Int. Cl.
    *H01L 45/00* (2006.01)
(52) U.S. Cl. ............. 257/4; 257/E45.002; 365/148
(58) Field of Classification Search ............. 257/2, 3, 257/4, 5, E45.002; 365/148
    See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,515,488 A | 5/1996 | Hoppe et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |

(Continued)

FOREIGN PATENT DOCUMENTS

CN    1959998    5/2007

(Continued)

OTHER PUBLICATIONS

"Magnetic Bit Boost," www.sciencenews.org, Dec. 18 & 25, 2004, p. 389, vol. 166.

(Continued)

*Primary Examiner* — Victor Mandala
*Assistant Examiner* — Scott Stowe (57) ABSTRACT

Memory cells are described along with methods for manufacturing. A memory cell as described herein includes a bottom electrode, a memory element and a side electrode. The bottom electrode contacts the memory element at a first contact surface on the bottom of the memory element. The side electrode contacts the memory element at a second contact surface on the side of the memory element, where the second contact surface on the side faces laterally relative to the first contact surface on the bottom.

12 Claims, 7 Drawing Sheets

U.S. PATENT DOCUMENTS

| | | |
|---|---|---|
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi |
| 6,815,704 B1 | 11/2004 | Chen |
| 6,830,952 B2 | 12/2004 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,897,467 B2 | 5/2005 | Doan et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,102,150 B2 | 9/2006 | Harshfield et al. |
| 7,126,149 B2 | 10/2006 | Iwasaki et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 7,485,891 B2 | 2/2009 | Hamann et al. |
| 7,541,607 B2 | 6/2009 | Asano et al. |
| 7,560,337 B2 | 7/2009 | Ho et al. |
| 7,663,135 B2 * | 2/2010 | Lung ................................ 257/4 |
| 2004/0051094 A1 | 3/2004 | Ooishi |
| 2005/0029502 A1 | 2/2005 | Hudgens |
| 2005/0093022 A1 | 5/2005 | Lung |
| 2005/0127347 A1 | 6/2005 | Choi et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0118913 A1 | 6/2006 | Yi et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0045606 A1 | 3/2007 | Magistretti et al. |
| 2007/0097738 A1 * | 5/2007 | Asano et al. .................. 365/163 |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |

FOREIGN PATENT DOCUMENTS

| | | |
|---|---|---|
| WO | WO-0079539 A1 | 12/2000 |
| WO | WO-0145108 A1 | 6/2001 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell

Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Axon Technologies Corporation paper: Technology Description, published in 1997, pp. 1-6.

Bedeschi, F. et al., "4-Mb MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell for Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Non-volatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase—Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

MEMORY CELL HAVING A SIDE ELECTRODE CONTACT

CROSS-REFERENCE TO RELATED APPLICATIONS

This application is a continuation of U.S. patent application Ser. No. 11/864,273 filed on 28 Sep. 2007; which application claims the benefit of U.S. Provisional Application 60/887,541, filed 31 Jan. 2007, entitled Memory Cell with Cup-Shaped Memory Element, which is incorporated by reference herein.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on memory materials, for example phase change random access memory (PCRAM) devices, and to methods for manufacturing such devices. The memory material is switchable between electrical property states by the application of energy. The memory materials may be phase change based memory materials, including chalcogenide based materials, and other materials.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

In phase change memory, data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell. One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

Accordingly, an opportunity arises to devise methods and structures that form memory cells with structures that have small active regions of programmable resistive material using reliable and repeatable manufacturing techniques.

SUMMARY OF THE INVENTION

A memory cell as described herein includes a bottom electrode, a memory element and a side electrode. The bottom electrode contacts the memory element at a first contact surface on the bottom of the memory element. The side electrode contacts the memory element at a second contact surface on the side of the memory element, where the second contact surface on the side faces laterally relative to the first contact surface on the bottom. As such, the current flow path between the side and bottom electrodes turns laterally within the memory element, so that the memory cell can be implemented with a smaller height.

In an embodiment described herein, the bottom electrode comprises a conductive member extending through a layer of dielectric fill from access circuitry in a substrate to the surface of the layer of dielectric fill. The side electrode comprises a portion of a bit line on the layer of dielectric fill, in which vias have been opened over corresponding bottom electrodes so that electrical connection between the bottom electrodes and bit line is broken. The memory element lies within the via contacting a bottom electrode at the first contact surface on the bottom of the memory element, and contacting the bit line on the second contact surface on the side of the memory element, and having an active region between the bottom electrode and the side electrode.

In embodiments illustrated, the memory element comprises a base portion on the bottom electrode and an annular portion on the base portion, the annular portion having an inner surface and an outer surface. The memory cell includes a dielectric fill material within an interior defined by the inner surface of the annular portion, and a side electrode contacting the outer surface of the annular portion.

A method for manufacturing a memory cell as described herein includes forming a bottom electrode and forming a side electrode on the bottom electrode. The method includes forming a via in the side electrode to expose a top surface of the bottom electrode, and forming a memory element within the via. The memory element contacts the top surface of the bottom electrode and contacts the side electrode at an interior surface of the via.

A memory cell as described herein results in an active region within the base portion of the memory cell that can be made extremely small, thereby reducing the amount of current needed for reset. The extremely small active region is a result of spacing the bottom electrode away from the side electrode such that current flowing therebetween is concentrated within the base portion of the memory element, and by the fill material within the interior surface of the annular portion providing thermal isolation to the active region. The thickness of the base portion can be established using thin film deposition techniques and thus can be made very thin. The bottom electrode has a diameter less than that of the base portion thereby focusing current in the base and creating a small active region. An additional advantage of the memory cell is that the memory element can be formed within a via in a bit line. In such an embodiment the bit line acts as a top electrode functionally, but actually contacts the memory element on the outside surface of the annular portion, providing a relatively large contact surface and creating a current flow path from the bottom electrode to the annular portion and turning laterally into the side electrode formed by the bit line.

Other features, aspects and advantages of the present invention can be seen on review the figures, the detailed description, and the claims which follow.

DETAILED DESCRIPTION OF THE INVENTION

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Figure 1:
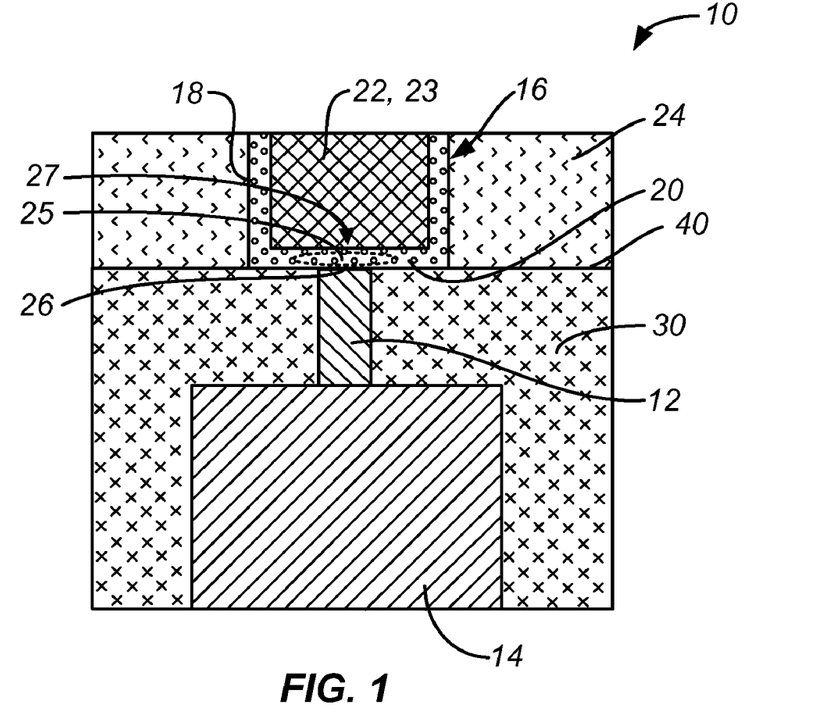
FIG. 1 is a simplified cross-sectional view of a memory cell in accordance with an embodiment.
Figure 2:
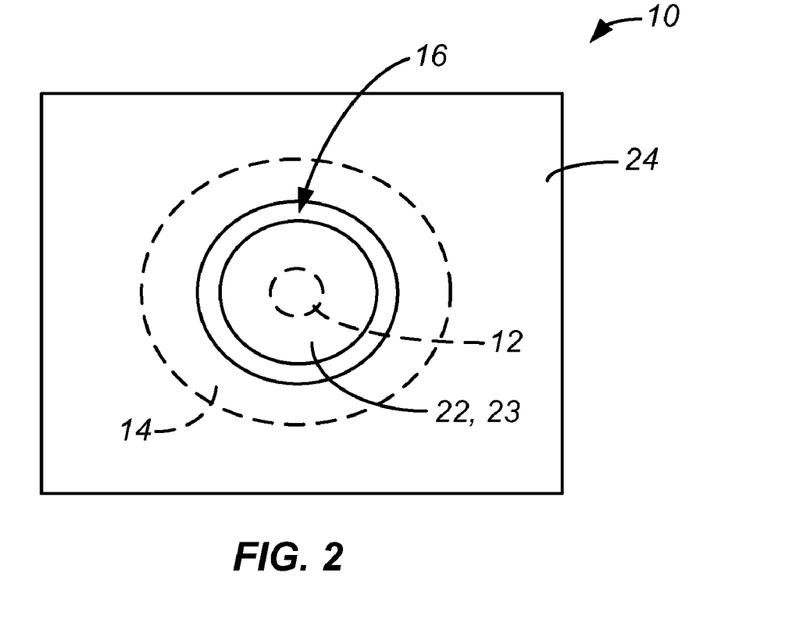
FIG. 2 is a top view, or plan view, of the memory cell illustrated in FIG. 1.

FIGS. 1 and 2 illustrate cross-sectional and top views respectively of a memory cell 100 having a cup-shaped memory element 110. The memory element 110 includes a base portion 112 and an annular portion 114 on the base portion 112.

A bottom electrode 120 contacts the bottom surface 116 of the base portion 112 and couples the memory element 110 to a conductive plug 130. The bottom electrode 120 may comprise, for example, TiN or TaN. TiN may be preferred in embodiments in which the memory element 110 comprises GST (discussed below) because it makes good contact with GST, it is a common material used in semiconductor manufacturing, and it provides a good diffusion barrier at the higher temperatures at which GST transitions, typically in the 600-700° C. range. Alternatively, the bottom electrode 120 may be TiAlN or TaAlN, or comprises, for further examples, one or more elements selected from the group consisting of Ti, W, Mo, Al, Ta, Cu, Pt, Ir, La, Ni, N, O and Ru and combinations thereof.

The conductive plug 130 extends through an inter-layer dielectric 140 to underlying access circuitry (no shown), the plug 130 preferably comprising a refractory metal such as tungsten. Other metals that could be used include Ti, Mo, Al, Ta, Cu, Pt, Ir, La, Ni, and Ru. Other plug structures and materials can be used as well.

The annular portion 114 of the memory element 110 includes an inside surface 117 and an outside surface 118. A side electrode 150 contacts the outer surface 118 of the annular portion 114. In some embodiments the side electrode 150 comprises a portion of a bit line. The side electrode 150 may comprise, for example, any of the materials described above with reference to the bottom electrode 120. In the illustrated embodiment the side electrode 150 comprises a single conductive material. In alternative embodiments the side electrode 150 may comprise multiple materials. For example the side electrode 150 may comprise a first material contacting the outer surface 118 of the annular portion 114 and chosen for compatibility with the material of the memory element 110, and a second material surrounding the first material and chosen for other advantages such as a lower electrical resistivity than the first material.

The inside surface 117 of the annular portion 114 defines an interior 160 containing a fill material 165. The fill material 165 is an electrically insulating material and is preferably a better thermal insulator than the material from which memory element 110 is made. Fill material 165 may comprise an electrical insulator including one or more elements selected from the group consisting of Si, Ti, Al, Ta, N, O, and C. It is preferred that fill material 165 be a low thermal conductivity material. In some preferred devices, fill material 165 has a low thermal conductivity, such as being less than about 0.014 J/cm*K*sec. In other preferred embodiments, when the memory element 110 is made from a phase change material, fill material 165 has a thermal conductivity less than that of the amorphous state of the phase change material, or less than about 0.003 J/cm*K*sec for a phase change material comprising GST. Representative thermally insulating materials include materials that are a combination of the elements silicon Si, carbon C, oxygen O, fluorine F, and hydrogen H.

Examples of thermally insulating materials which are candidates for use for fill material 165 include $SiO_2$, SiCOH, polyimide, polyamide, and fluorocarbon polymers. Other examples of materials which are candidates for use for fill material 165 include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void for thermal insulation. A single layer or combination of layers within fill material 165 can provide thermal and electrical insulation.

The inter-layer dielectric 140 may comprise one or more layers of dielectric material, each of the layers comprising, for example, any of the materials discussed above with reference to the fill material 165.

In operation, voltages on the plug 130 and side electrode 150 can induce current to flow from the plug 130 to the side electrode 150, or vice-versa, via the bottom electrode 120 and memory element 110.

The active region 115 is the region of the memory element 110 in which the memory material is induced to change between at least two solid phases. As can be appreciated the active region 115 can be made extremely small in the illustrated structure, thus reducing the magnitude of current needed to induce a phase change. The thickness 170 of the memory material of memory element 110 can be established using a thin film deposition technique of memory material within a via in the side electrode 150. In some embodiments the thickness 170 is less than or equal to about 10 nm, for example being between 1 and 10 nm. Furthermore, the bottom electrode 120 has a width or diameter 125 which is preferably less than a minimum feature size for a process, typically a lithographic process, used to form the memory cell 100. The small bottom electrode 120 concentrates current density in the portion of the memory element 110 adjacent the bottom electrode 120, thereby reducing the magnitude of the current needed to induce a phase change in the active region 115. Additionally, the fill material 165 provides thermal isolation to the active region 115 which also helps to reduce the amount of current necessary to induce a phase change.

The contact surface between the bottom electrode 120 and the memory element 110 has a surface normal 111 that is generally in the vertical direction in the cross-sectional view of FIG. 1. Because of the annular shape of the memory element in the illustrated embodiment, the contact surface between the side electrode 150 and the memory element 110 has surface normals 113 in the radial direction including normals 113 that extend generally in the horizontal direction in the cross-section illustrated in FIG. 1. Thus, the normals 111, 113 intersect at an angle of approximately 90 degrees in the illustrated embodiment. As such, in operation the current flow path from the bottom electrode 120 to the memory element 110 turns laterally into the side electrode 150, thereby concentrating the current density in the portion of the memory element 110 adjacent the bottom electrode 120 and reducing the magnitude of the current needed to induce a phase change in the active region 115. In practice, the normals 111, 113 may not intersect at approximately 90 degrees, but will intersect at an angle that depends on the shape of the via in which the memory element is formed. For example, the via may be conical with inside surfaces tapering, typically outwardly, from the bottom by a relatively large angle. Thus, the second contact surface of the memory element comprises a conical or cylindrical surface in contact with an inside surface of the via.

Embodiments of memory cell 100 include phase change based memory materials, including chalcogenide based materials and other materials, for memory element 110. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

Representative chalcogenide material can be characterized as follows: $Ge_xSb_yTe_z$, where x:y:z=2:2:5. Other compositions can be used with x: 0~5; y: 0~5; z: 0~10. GeSbTe with doping, such as N—, Si—, Ti—, or other element doping, may also be used. These materials can be formed by PVD sputtering or magnetron-sputtering with reactive gases of Ar, $N_2$, and/or He, etc. and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens of volts to several hundreds of volts is also used. Also, the combination of DC bias and the collimator can be used simultaneously. The post deposition annealing treatment with vacuum or N2 ambient is sometimes needed to improve the crystallized state of chalcogenide material. The annealing temperature typically ranges 100° C. to 400° C. with an anneal time of less than 30 minutes.

FIGS. 3-14 illustrate steps in a fabrication sequence in accordance with an embodiment for manufacturing memory cells as described herein.

Figure 3:
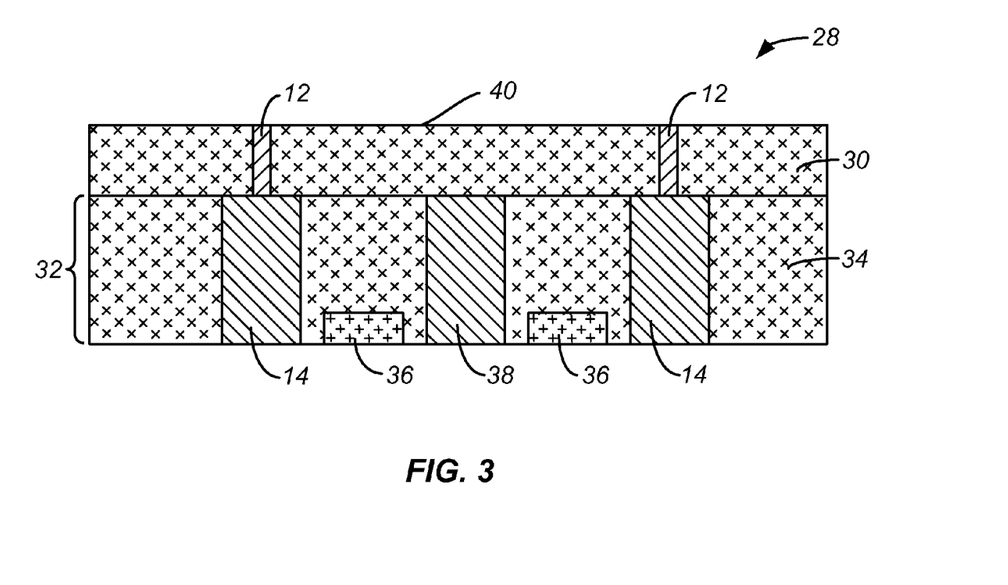
FIGS. 3-14 illustrate stages in a fabrication sequence in accordance with an embodiment for manufacturing a memory cell.

FIG. 3 illustrates a cross-sectional view of a structure formed as a first stage of the fabrication sequence, the structure including an array of bottom electrodes 120 in a dielectric layer 144 and contacting respective plugs 130 in a memory cell access layer 300. The memory access layer 300 can be formed by standard processes as known in the art and includes word lines 340 extending in parallel in a direction into and out of the cross section illustrated in FIG. 3. The word lines 340 overly a substrate 310 and form the gates of access transistors. Access layer 300 also includes a common source line 350 contacting doped region 330 acting as the source regions of the access transistors. In other embodiments the common source line 350 may be implemented by a doped region in the substrate 310. The plugs 130 contact corresponding doped regions 320 in the substrate 310 acting as drain regions for the access transistors.

The bottom electrodes 120 have a diameter 125 which is preferably less than a minimum feature size for a process, generally a lithographic process, used to manufacture the memory access layer 300.

The bottom electrodes 120 having a sublithographic diameter 125 and the dielectric layer 144 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode", which is incorporated by reference herein. For example, a layer of electrode material can be formed on the top surface 360 of the access layer 300, followed by patterning of a layer of photoresist on the electrode layer using standard photo lithographic techniques so as to form a mask of photoresist overlying the locations of the bottom electrodes 120. Next the mask of photoresist is trimmed, using for example oxygen plasma, to form mask structures having sublithographic dimensions overlying the locations of the bottom electrodes 120. Then the layer of electrode material is etched using the trimmed mask of photoresist, thereby forming the bottom electrodes 120 having sublithographic diameters 125. Next dielectric material 144 is formed and planarized, resulting in the structure illustrated in FIG. 3.

As another example, the bottom electrodes 120 and dielectric layer 144 can be formed using methods, materials, and processes as disclosed in U.S. patent application Ser. No. 11/855,979 filed on 14 Sep. 2007, entitled "Phase Change Memory Cell in Via Array with Self-Aligned, Self-Converged Bottom Electrode and Method for Manufacturing", which is incorporated by reference herein. For example, the dielectric layer 144 can be formed on the top surface 40 followed by sequentially forming an isolation layer and a sacrificial layer. Next, a mask having openings close to or equal to the minimum feature size of the process used to create the mask is formed on the sacrificial layer, the openings overlying the locations of the bottom electrodes 120. The isolation layer and the sacrificial layers are then selectively etched using the mask, thereby forming vias in the isolation and sacrificial layers and exposing a top surface of the dielectric layer 144. After removal of the mask, a selective undercutting etch is performed on the vias such that the isolation layer is etched while leaving the sacrificial layer and the dielectric layer 144 intact. A fill material is then formed in the vias, which due to the selective undercutting etch process results in a self-aligned void in the fill material being formed within each via. Next, an anisotropic etching process is performed on the fill material to open the voids, and etching continues until the dielectric layer 144 is exposed in the region below the void, thereby forming a sidewall spacer comprising fill material within each via. The sidewall spacers have an opening dimension substantially determined by the dimensions of the void, and thus can be less than the minimum feature size of a lithographic process. Next, the dielectric layer 144 is etched using the sidewall spacers as an etch mask, thereby forming openings in the dielectric layer 144 having a diameter less than the minimum feature size. Next, an electrode layer is formed within the openings in the dielectric layer 144. A planarizing process, such as chemical mechanical polishing CMP, is then performed to remove the isolation layer and the sacrificial layer and to form the bottom electrodes 120, resulting in the structure illustrated in FIG. 3.

Figure 4:
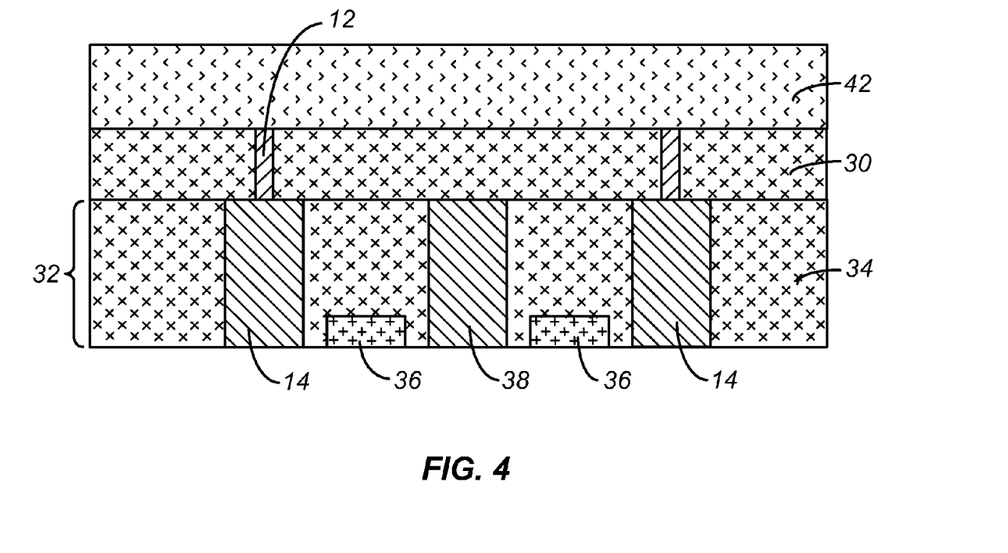

Next, a conductive layer 400 comprising bit line material, for example Al, Cu, alloys of Al and Cu, W, Ta, Ti, N or other materials or a combination of materials are formed on the structure illustrated in FIG. 3, resulting in the structure illustrated in FIG. 4.

Figure 5:
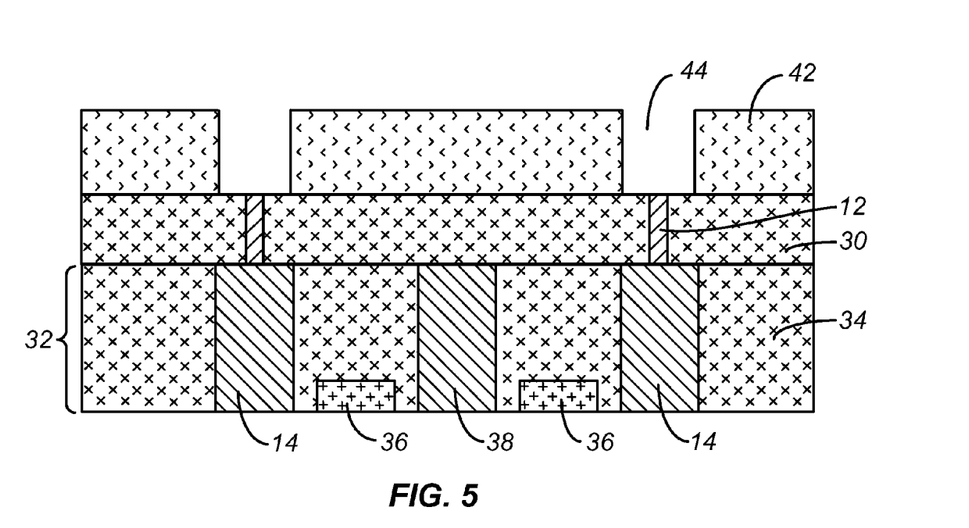
Figure 6:
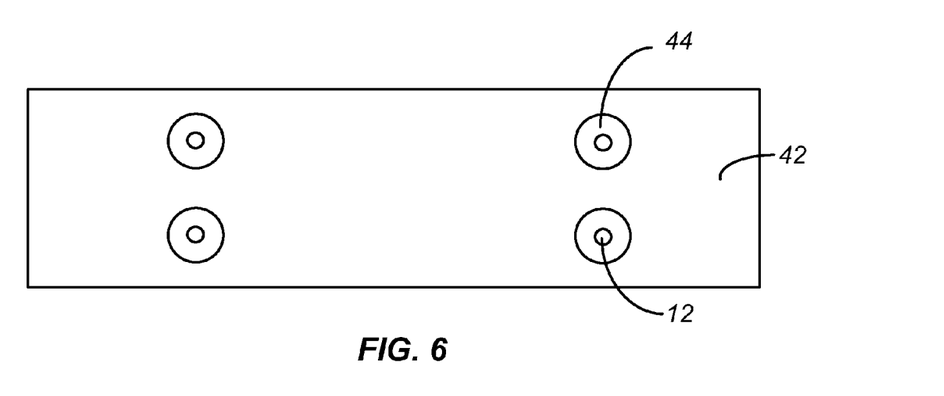

FIGS. 5 and 6 illustrate cross-sectional and top views respectively after the formation of vias 500 within the conductive layer 400, the vias 500 aligned with the bottom electrodes 120.

Figure 7:
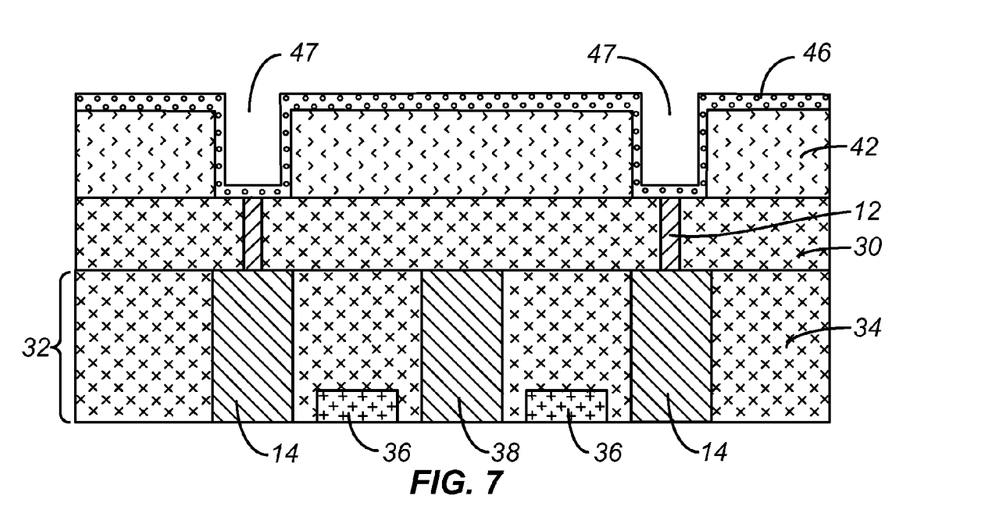
Figure 8:
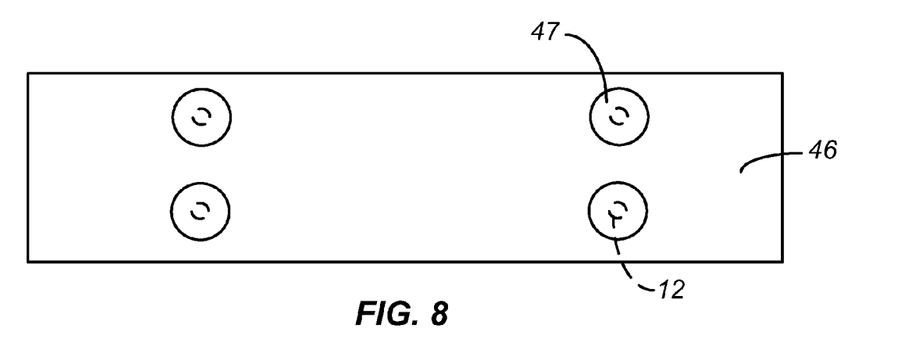

Next, a conformal layer of memory material 700 is deposited on the structure illustrated in FIGS. 5 and 6, resulting in the structure illustrated in the cross-sectional and top views of FIGS. 7 and 8 respectively. As can be seen in the FIGS. 7 and 8, the layer of memory material 700 is formed within the vias 500 of FIGS. 5 and 6 and defines openings 710.

In some embodiments a layer of liner material is formed on the sidewalls of the vias 500 prior to the deposition of the layer of memory material 700. The liner material can be conformally deposited on the structure illustrated in FIGS. 5 and 6 and then anisotropically etched such that the liner material only remains on the sidewalls of the vias 500. Advantages of using a liner material to act as an interface between the memory material 700 and the bit line material 400 within the via 500 may include improved reliability of the memory cells since the liner material may chosen for compatibility with the memory material 700 (for example comprising TiN in embodiments in which the memory material comprises GST as discussed above) while the bit line material 400 can be chosen other advantages such as a lower resistance, etc.

Figure 9:
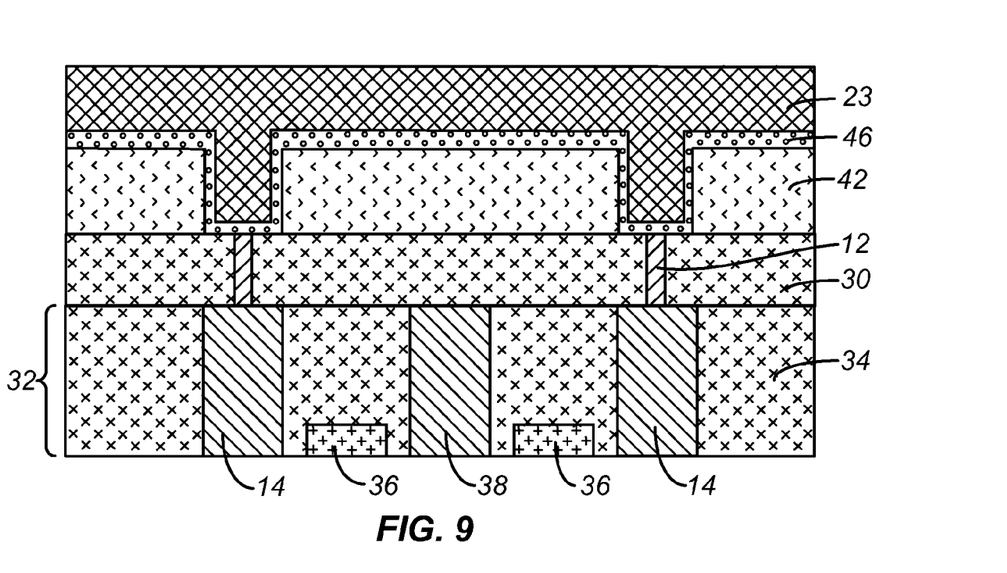
Figure 10:
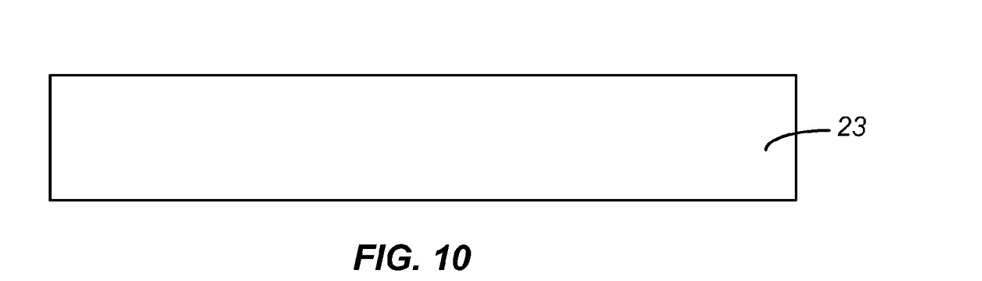

Next, fill material 165 is formed on the structure illustrated in FIGS. 7 and 8, resulting in the structure illustrated in the cross-sectional and top views of FIGS. 9 and 10 respectively.

In the illustrated embodiment fill material 165 completely fills openings 710, while other embodiments may include voids within the fill material 165, the voids filled with or without an insulating gas.

Figure 11:
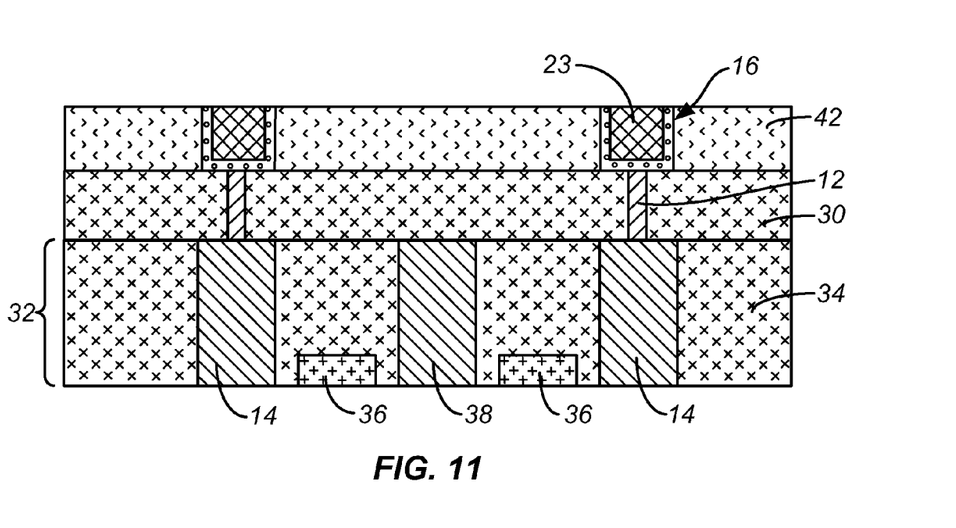
Figure 12:
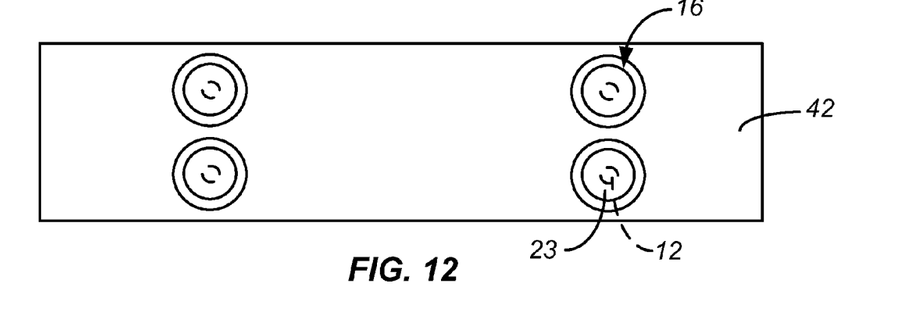

Next, the structure illustrated in FIGS. 9 and 10 is planarized, for example using chemical mechanical polishing CMP, resulting in the structure having memory elements 110 as illustrated in cross-sectional and top views of FIGS. 11 and 12 respectively.

Figure 13:
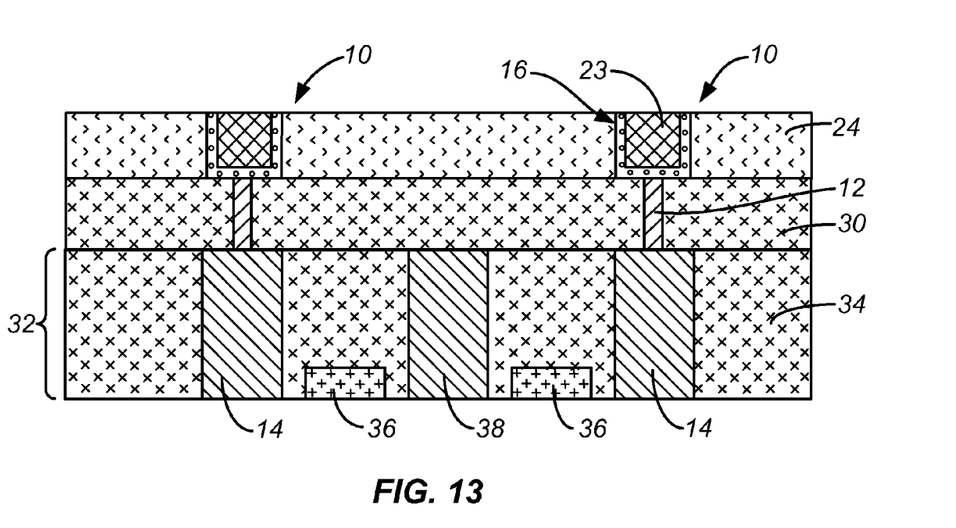
Figure 14:
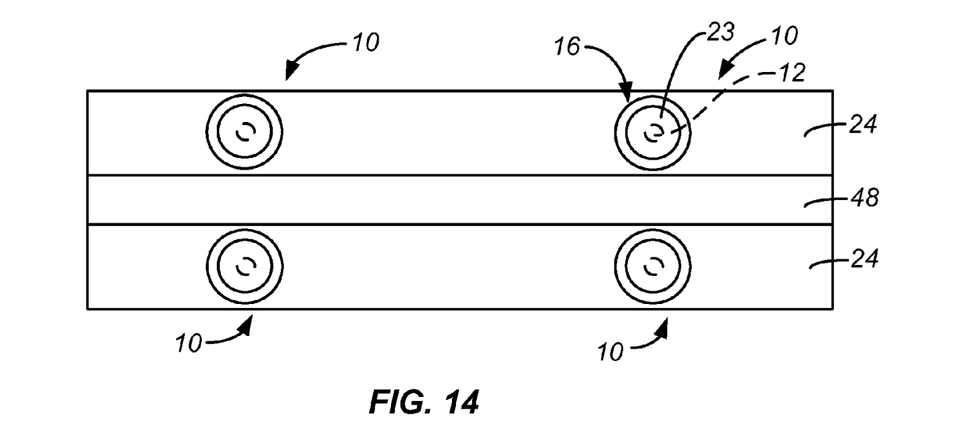

Next, conductive layer 400 is patterned to form trench 1300 and bit lines 150, resulting in the structure having memory cells 100 as illustrated in the cross-sectional and top views of FIGS. 13 and 14 respectively.

A memory cell 100 as described herein includes a small active region 115 in the memory element 110, and accordingly, the magnitude of the reset current necessary to induce a phase change is very small.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. For example, base portion 112 of memory element 110 is illustrated as a constant diameter disk. However, in practice the base portion 112 will typically not be a true disk shaped element but will typically have a somewhat irregular circumference and a variable thickness. In addition, it may be desired to deposit memory material 700 in a manner such that it is thinnest where it contacts bottom electrode 120 to help reduce the volume of active region 115.

Any and all patents, patent applications and printed publications referred to above are hereby incorporated by reference.

What is claimed is:

1. A memory device comprising:
   a bottom electrode having a width and a top surface;
   an access line having a via extending there through such that the access line completely surrounds a perimeter of the via, the via overlying the bottom electrode and having a width greater than the width of the bottom electrode, the via having an inner surface; and
   a memory element within the via, the memory element having a bottom surface in contact with the top surface of the bottom electrode, and having an outer surface surrounded by and in contact with the inner surface of the via.

2. The memory device of claim 1, wherein an inter-electrode current path between the bottom electrode and the access line turns laterally within the memory element relative to the direction of current flow at the top surface of the bottom electrode.

3. The memory device of claim 1, wherein:
   the memory element includes a base portion and an annular portion on the base portion, the base portion having a bottom surface extending the width of the via and in contact with the top surface of the bottom electrode, and the annular portion having an outer surface surrounded by and in contact with the inner surface of the via, and the annular portion having an inner surface defining an interior within the via; and further comprising:
   a fill material within the interior defined by the inner surface of annular portion.

4. The memory device of claim 3, wherein the fill material comprises a dielectric material.

5. The memory device of claim 3, wherein the base portion has a thickness between the bottom surface and a top surface, through which current is confined in an inter-electrode current path.

6. The memory device of claim 1, wherein the memory element has an active region adjacent the top surface of the bottom electrode.

7. The memory device of claim 1, wherein a first contact area between the memory element and the bottom electrode is less than a second contact area between the memory element and the access line.

8. The memory device of claim 1, wherein the inner surface of the via is cylindrical, such that an inter-electrode current path spreads radially outward from the top surface of the bottom electrode to the inner surface of the via.

9. The memory device of claim 1, further comprising a fill layer having a top surface, and wherein:
   the bottom electrode extends to the top surface of the fill layer; and
   the access line is on the top surface of the fill layer.

10. The memory device of claim 1, wherein the access line comprises a first conductive material contacting the memory element at the inner surface of the via, and a second conductive material separated from the memory element by the first material, the second material having a lower electrical resistivity than that of the first material.

11. A memory device comprising: a conductive contact having a top surface; a conductive line over the conductive contact; a via through the conductive line such that the conductive line completely surrounds a perimeter of the via, and the via having a bottom area, wherein the top surface of the conductive contact is in the bottom area of the via; and
   a cup-shaped memory element within the via and coupled to the conductive contact and the conductive line, the memory element having an outer surface surrounded by an inner surface of the via.

12. A memory device comprising:
   a bit line having a via, such that the bit line completely surrounds a perimeter of the via, the via having a width and an inner surface;
   a bottom electrode under the via and having a width, the width of the via larger than the width of the bottom electrode;
   and a concave memory element having a base portion and a sidewall portion within the via, the base portion coupled to the bottom electrode and the sidewall portion is coupled with the bit line, and the sidewall portion of the memory element has an outer surface surrounded by the inner surface of the via.

* * * * *